United States Patent
Chiesa et al.

(10) Patent No.: US 8,167,041 B2
(45) Date of Patent: May 1, 2012

(54) APPARATUS AND METHOD FOR ENERGY-EFFICIENT AND ENVIRONMENTALLY-FRIENDLY RECOVERY OF BITUMEN

(75) Inventors: Matteo Chiesa, Abu Dhabi (AE); Vincent Berube, Brossard (CA); Andy Muto, Cambridge, MA (US); Anurag Bajpayee, Cambridge, MA (US); Daniel Kraemer, Cambridge, MA (US)

(73) Assignee: Masdar Institute of Science and Technology, Abu Dhabi (AE)

( * ) Notice: Subject to any disclaimer, the term of this patent is extended or adjusted under 35 U.S.C. 154(b) by 258 days.

(21) Appl. No.: 12/496,693

(22) Filed: Jul. 2, 2009

(65) Prior Publication Data

US 2010/0000733 A1    Jan. 7, 2010

Related U.S. Application Data

(60) Provisional application No. 61/078,054, filed on Jul. 3, 2008.

(51) Int. Cl.
*E21B 36/00* (2006.01)
*E21B 43/24* (2006.01)
*E21B 43/34* (2006.01)

(52) U.S. Cl. ............... 166/267; 60/641.15; 126/688; 126/692; 126/714; 136/205; 166/75.12; 166/268; 166/272.1; 166/272.3; 166/302; 166/303; 208/106; 208/187

(58) Field of Classification Search ................. None
See application file for complete search history.

(56) References Cited

U.S. PATENT DOCUMENTS

| | | | |
|---|---|---|---|
| 4,160,479 A * | 7/1979 | Richardson et al. | 166/267 |
| 4,174,752 A * | 11/1979 | Slater et al. | 166/272.1 |
| 4,249,605 A * | 2/1981 | Slater et al. | 166/266 |
| 4,252,107 A * | 2/1981 | Horton | 126/605 |
| 4,289,204 A * | 9/1981 | Stewart | 166/303 |
| 5,058,675 A * | 10/1991 | Travis | 166/272.3 |
| 5,795,464 A * | 8/1998 | Sankey et al. | 208/391 |
| 7,377,843 B2 * | 5/2008 | Koops | 452/58 |
| 7,484,561 B2 * | 2/2009 | Bridges | 166/248 |
| 2003/0155111 A1 * | 8/2003 | Vinegar et al. | 166/59 |
| 2007/0193744 A1 * | 8/2007 | Bridges | 166/272.1 |
| 2008/0116694 A1 * | 5/2008 | Hendershot | 290/1 R |

\* cited by examiner

*Primary Examiner* — George Suchfield
(74) *Attorney, Agent, or Firm* — Grossman Tucker Perreault & Pfleger, PLLC

(57) ABSTRACT

A system and method for energy-efficient and environmentally-friendly recovery of bitumen aims at recovering unconventional oil in an environmentally friendly and sustainable way that has the potential of eliminating the need of natural gas currently employed for steam production and power generation. The system and method aims at providing low temperature steam for the stimulation of the formation by means of solar radiation. In addition, the system and method provides a novel solution for hydrogen production that does not employ reforming of natural gas. Furthermore, the use of thermoelectric devices in combination with low temperature steam can be employed to power an electrolysis plant to generate the hydrogen necessary to produce synthetic oil.

14 Claims, 11 Drawing Sheets

APPARATUS AND METHOD FOR ENERGY-EFFICIENT AND ENVIRONMENTALLY-FRIENDLY RECOVERY OF BITUMEN

CROSS-REFERENCE TO RELATED APPLICATIONS

This application claims the benefit of U.S. Provisional Patent Application No. 61/078,054, entitled, "Method for Recovery of Bitumen from Oil Sand: An Environmentally Friendly and Energy Efficient Alternative to Conventional Oil Recovery of Unconventional Oil Reserves," filed Jul. 3, 2008, which is hereby incorporated by reference in its entirety.

TECHNICAL FIELD

The present invention relates generally to recovery of bitumen from oil sand and specifically to an environmentally-friendly system incorporating solar-powered generation of steam to increase the viscosity of bitumen and the efficiency of recovery.

BACKGROUND

The worldwide global demand for oil has grown by 150% since 1965 and 20% in the past 20 years to the current 80 million barrels per day, and is projected to grow by 50% more in the next 20 years. The growth in global demand for oil comes at a time when the supply from relatively cheap conventional sources is declining, and reserves are not being replaced with new discoveries. However, the world has over twice as much supply of heavy oil and bitumen than it does of conventional oil. Not including hydrocarbons in oil shale, it is estimated that there are 8-9 trillion barrels of heavy oil and bitumen worldwide, of which potentially 900 billion barrels of oil are commercially exploitable with existing technology. The definition of "conventional oil" is not constant and is highly dependent on shifts in technological development and employment of newer recovery techniques. Thermal production, for example, has moved unconventional sources into the conventional category in places like California where thermal heavy-oil projects have been in operation since the 1960's.

Surface mining reaches maximum depths of 100 m and is the most commonly used recovery technique. The main drawbacks of bitumen surface mining are the low recovery factors and large environmental footprints related to this production method. On the other hand, in-situ commercial operations have emerged using cyclic steam stimulation (CSS) and steam assisted gravity drainage (SAGD). CSS operations rely on the injection of steam into a well at a temperature of 300 to 340° C. for a period of weeks to months. Then the well is allowed days to weeks for the heat to soak into the formation and the hot oil is later pumped out of the well for a period of weeks or months. Once the production rate falls off, the well is put through another cycle of injection, soaking and production. The main advantage of this method is that the recovery factors are around 20 to 25%, while the main drawback is the substantial cost of the steam injection.

SAGD belongs to the same group of technologies that employ steam to stimulate the oil sand formation; however, it differs from CSS in the sense that it is continuous as opposed to being cyclical and that it allows for very high oil production rates. In SAGD, two horizontal wells are drilled in the oil sands, one at the bottom of the formation and another about 5 meters above it. These wells are typically drilled in groups off of central pads and can extend for miles in all directions. In each well pair, steam is injected into the upper well. The heat reduces the viscosity of the bitumen allowing it to flow into the lower well from which it is pumped to the surface. SAGD is a major breakthrough in oils and production technology since it is cheaper than CSS, and recovers up to 60% of the available oil.

The use of steam to stimulate the formation requires large amounts of energy, most of which is obtained by burning natural gas which is available in the oil sand area. Approximately 1.0 to 1.25 GJ of natural gas are needed to produce the steam necessary to extract one barrel of bitumen from the oil sand. Since a barrel of oil is equivalent to 6.117 GJ, 1-20% of the energy stored in the extracted bitumen is required for the extraction process. Once a barrel of bitumen is extracted, another 1.0 to 1.25 GJ of natural gas are required to upgrade the bitumen to synthetic oil that complies with the quality receivable from refineries. The overall energy required for producing a barrel of synthetic oil therefore accounts for a third of the equivalent energy in a barrel of crude oil. This use of large amounts of natural gas for steam generation makes oil sands operations large single source emitters of greenhouse gases. As concern about climate change grows and $CO_2$ reduction targets come into effect, a considerable increase in operational costs for oil sand production is expected and minimizing the carbon footprint of traditional methods of oil production is desirable.

SUMMARY

Natural gas is currently the predominant fuel used to generate steam, but it is becoming more expensive due to limited supply in specific locations. Alternative fuels such as coal, heavy oil, or by products of heavy oil upgrading could be used, but simply burning them will release large quantities of $CO_2$ unless capture and sequestration is employed to minimize greenhouse gases. Nuclear power has also been proposed, but remains controversial in some areas. The use of concentrated solar energy, as disclosed herein, can play an important role in facing the challenges faced by oil recovery from oil sand in a sustainable way. Heavy oil, extra-heavy oil, and bitumen projects are large undertakings and very capital intensive. In addition to the production infrastructure, additional upgrading, refining, and transportation facilities are needed. Pipelines for heavy oil, natural gas and possibly for $CO_2$ sequestration would be required, increasing even further the conventional infrastructure investment. These projects have long operating and payback periods, so unstable (growing) oil and gas prices can deteriorate the investment prospect. In this scenario, using solar powered steam generation in oil sand mining may provide huge potential savings, less exposure to gas prices and supply disruption, and may hedge investment against potential $CO_2$ regulations while providing an environmentally friendly way to tap our huge oil sand reserves.

Embodiments of the present invention provide an alternative method for the recovery of hydrocarbon from oil sands in a gas constrained environment with or without $CO_2$ constraints. This method may recover unconventional oil in an environmentally friendly and sustainable way that has the potential of eliminating the need of natural gas currently employed for steam production and power generation. This method may provide low temperature steam for the stimulation of the formation by means of solar radiation. Consistent with further embodiments of the present invention, the use of thermoelectric devices in combination with low temperature steam can be employed to power an electrolysis plant to generate the hydrogen necessary to produce synthetic oil.

BRIEF DESCRIPTION OF THE DRAWINGS

These and other features and advantages will be better understood by reading the following detailed description, taken together with the drawings wherein.

DETAILED DESCRIPTION OF THE PREFERRED EMBODIMENTS

In general, solar thermal technologies are based on the concept of concentrating solar radiation to produce steam or hot air, which can then be used for electricity generation using conventional power cycles. Overall solar-electric efficiencies are lower (~20%) than the conversion efficiencies of conventional steam or combined cycles, as they include the conversion of solar radiation into heat within the collector and then the conversion of that heat to electricity in the power block. The conversion efficiency of the power block remains essentially the same as in fuel fired power plants.

Figure 1:
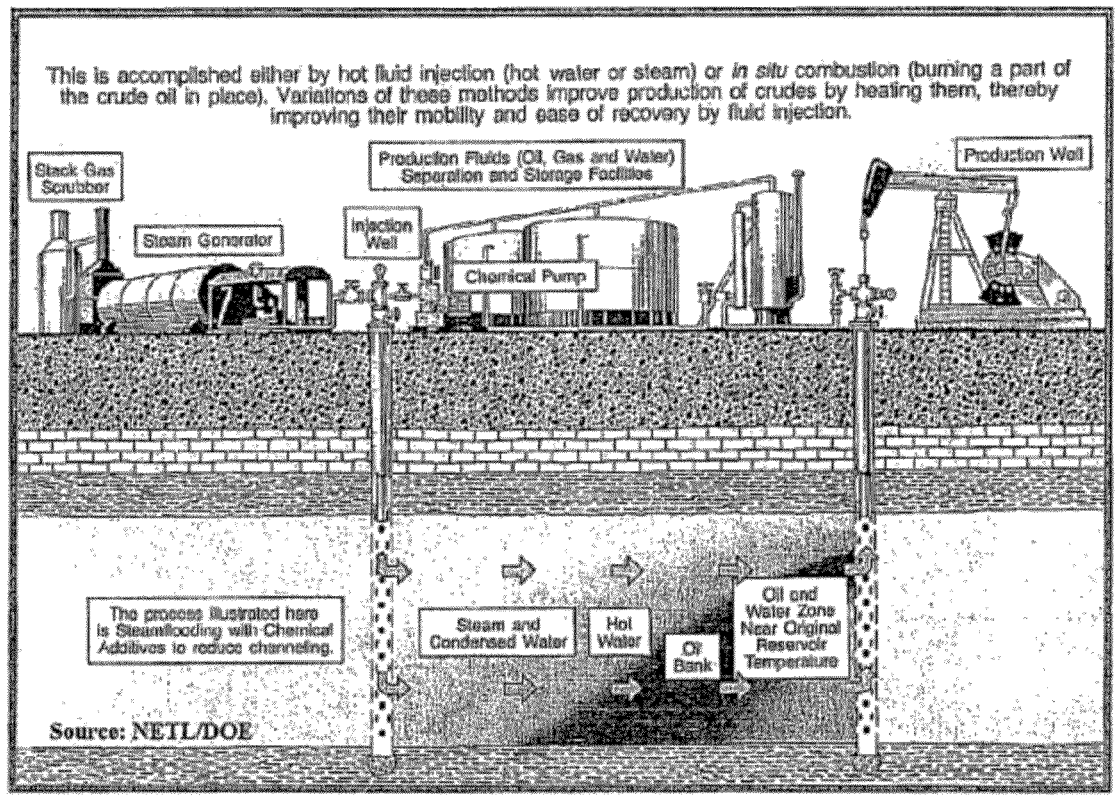
FIG. 1 is a schematic illustration of Cyclic Steam Stimulation oil production from oil sand.
Figure 2:
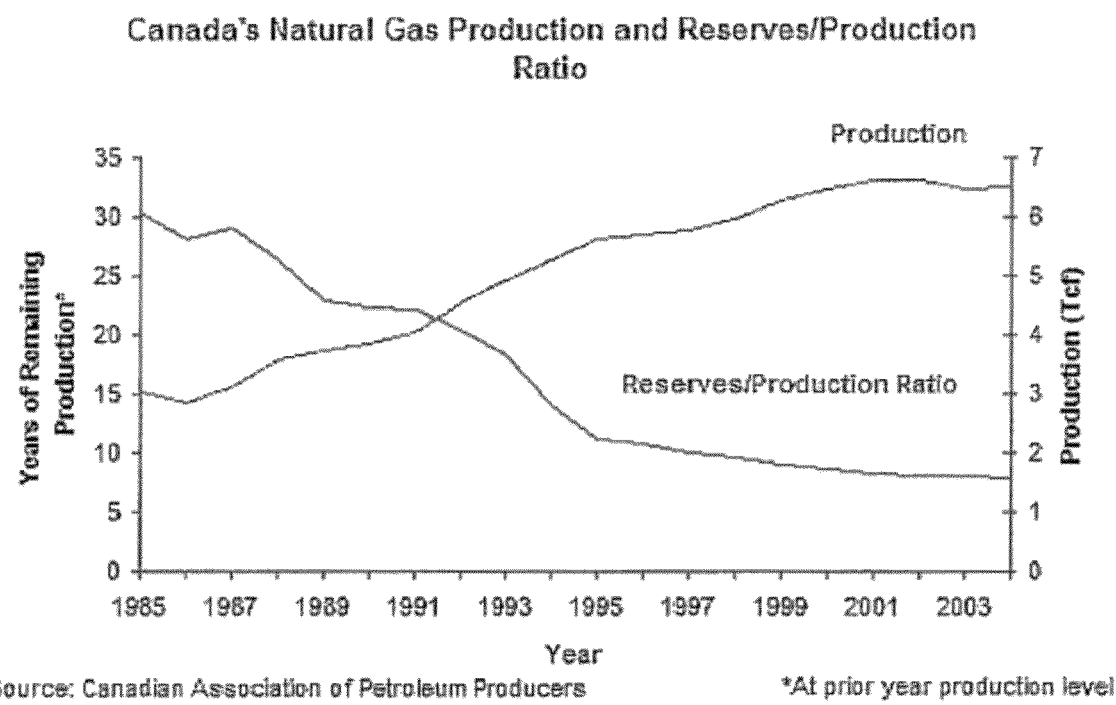
FIG. 2 is a graph illustrating Canada's natural gas production and reserves/production ratio showing that, despite the increased drilling activity, Canada's production/reserves ratio (the number of years of proven reserves remain at existing production levels) has declined from 30 in 1985 to 7 years in 2004.
Figure 3:
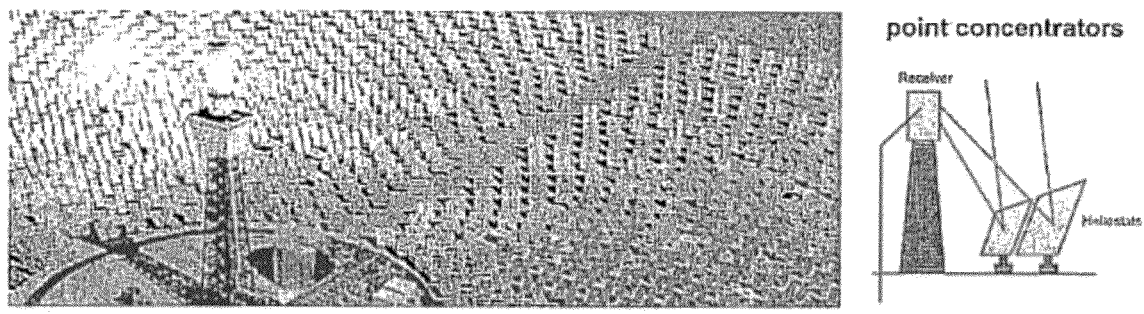
FIG. 3 is a schematic illustration of a point focusing system for producing concentrated solar energy.

Solar thermal power plants employ point focusing (FIG. 3) or line focusing (FIG. 4) systems to concentrate sunlight, which in turn may be used to generate steam.

The thermal efficiency of the solar thermal collectors is higher when steam is generated directly as opposed to the process of going through a heat transfer medium to collect the heat from solar radiation and then transferring this energy to steam. The latter method involves a temperature drop across the heat transfer medium and is thermally less efficient.

Figure 4:
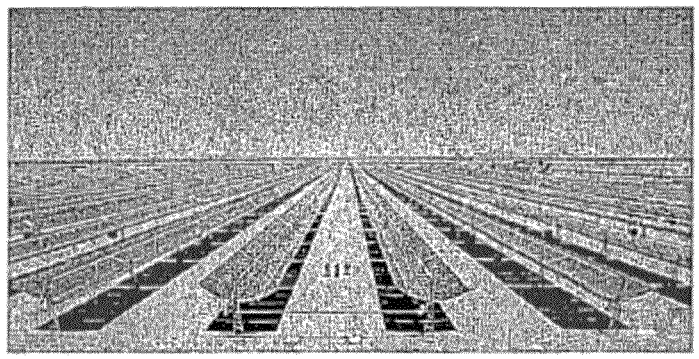
FIG. 4 is a schematic illustration of a line focusing system for producing concentrated solar energy.
Figure 4:
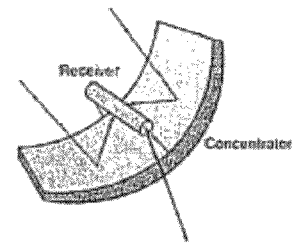
Figure 5:
FIG. 5 is a schematic illustration of a line focusing system with flat mirrors.

Line focusing systems are less complicated with concentrations of 70-100 times and the achievable operating temperatures in the range of 350 to 550° C. These systems employ direct steam generation without the need of a heat exchange medium. In FIGS. 4 and 5, two different design possibilities are illustrated. The first one is a solar trough system using parabolic minors to concentrate the solar radiation on a line focus. The second design uses several flat minors for that purpose.

Point focusing systems use a field of distributed minors called heliostats that individually track the sun and focus the sunlight at the top of a tower concentrating the sunlight 600-1500 times and delivering temperatures of about 550° C. Development is underway to increase the temperature range from 800° C. to well over 1000° C. In this case the solar energy is absorbed by a buffer fluid and then used to generate high temperature steam that eventually provides a higher efficiency in the power cycle. While line focusing systems generally generate steam directly, direct generation of steam may be achieved in point focusing system when the light that is concentrated on the receiver is redirected to a steam generating unit on the ground. This configuration is advantageous from a structural point of view although the optical efficiency may be somewhat compromised.

In the methods consistent with embodiments of the present invention, both line focusing and point focusing techniques may be used. Glass mirrors are a popular choice for concentration systems because of their very high reflectivity. Other reflecting materials that can meet the needs of solar thermal power plants are also under development.

Unlike conventional practice, the proposed method intends to use steam generated at temperatures between 230 to 350° C. Decreased radiation losses at lower temperatures and the possibility of direct steam generation with no working intermediate heat exchange fluid will enhance the overall thermal efficiency of the system. The use of mid temperature steam allows for employment of the technology even in locations with relatively low solar radiation.

This mid temperature steam generated throughout concentrating system is injected into the formation where the bitumen is extracted from. As previously indicated, an average of 3 barrels of water is required for the extraction of one barrel of bitumen. In a typical scenario of daily oil production of 10,000 barrels, about 30,000 barrels of water need to be converted to steam and be injected into the formation. Steam will be injected at high rates during times of peak solar radiation while little or no steam will be available during nights. Yet the daily requirement of heat necessary to stimulate the formation will be delivered entirely during the radiation period. The injected thermal energy diffuses into the formation causing the bitumen to decrease in viscosity and thus enabling it to be pumped out. The formation acts as a huge thermal mass with a response time longer than 1 day, and as long as enough energy is injected during the period of solar availability, the system may be utilized continuously to extract the desired daily amount of bitumen.

Figure 6:
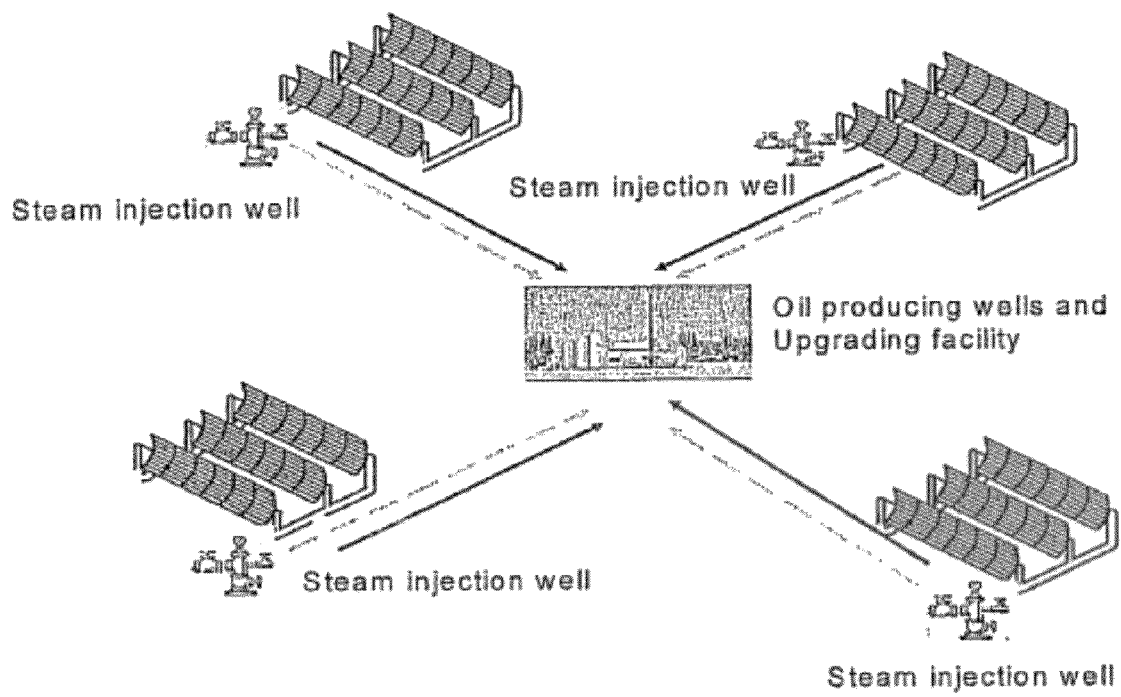
FIG. 6 is a schematic illustration of an embodiment of a system where steam is injected throughout injection wells in the proximity of a solar steam generation unit and oil is collected from multiple oil wells located in a centralized process facility.
Figure 7:
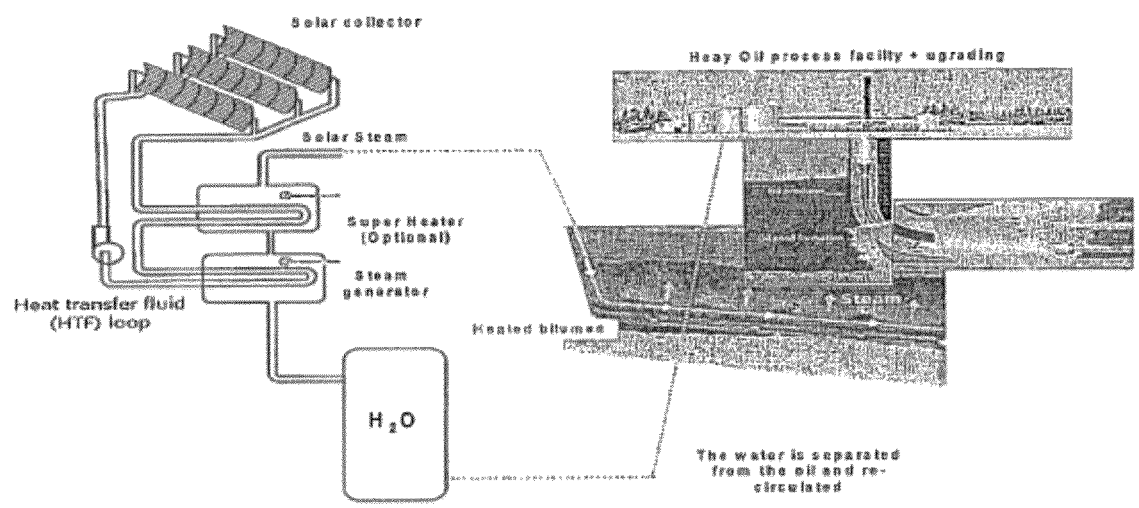
FIG. 7 is a schematic illustration of a solar steam generation unit in combination with a SAGD.

The proposed method uses a similar well configuration as the conventional SAGD with two major variations. First, in order to account for the variation in steam generation rates, the steam injecting well will have a larger diameter than the oil injecting well. This will allow for the steam flow rate to be varied and controlled during the day depending on the solar availability. Secondly, the proposed configuration employs local steam injection as close as possible to the location where the steam is generated and a centralized oil producing facility where the oil is produced from multiple horizontal wells as illustrated in FIGS. 6 and 7.

The concepts illustrated thus far can significantly reduce the energy necessary for the formation of steam and the production of bitumen. In addition, methods consistent with embodiments of the present invention may address the need of natural gas as the heating fuel for bitumen upgrading process and as a necessary commodity required to produce the hydrogen that is essential for the thermal cracking process of upgrading of bitumen to synthetic oil.

The oil recovery from oil sand can be made fully independent of natural gas by performing the upgrading of the bitumen into synthetic oil using solar energy as well. The upgrading process demands that the extracted bitumen be brought to a temperature between 370 and 410° C. This process demands as much energy as the process whereby the viscosity of the bitumen is reduced in-situ. The heat can thus be provided by doubling the surface area of the collectors in order to generate additional steam that will then be run into pipes so as to increase the temperature of the bitumen. To reconcile the continuous upgrading of the bitumen with the periodic nature of the solar steam production, molten salt or other phase change materials (depending on the required storage temperature) as energy storage systems can be used as the working fluid for a fraction of the solar collector. The heat stored in the molten salt during the day can then be used over night for the upgrading process.

A hybrid system where solar generated steam is used for the upgrading during the day and natural gas is used during the night and periods of low insolation can also be envisioned. While such a system does not make the bitumen upgrading fully gas independent, it provides a solution to substantially reduce the natural gas input necessary which can prove essential in a gas constrained environment.

If some natural gas is available, it may be used to produce hydrogen. However, in a natural gas constrained situation, such as the one foreseen in Alberta, the natural gas reforming process to provide hydrogen can be replaced by an electrolysis plant. Including this would result in a 100% natural gas independent facility. Also, the electrical power required for electrolysis as well as for the tracking and pumping units within the solar stream generation plant may be produced by scavenging waste heat from the surface of the boiler. This cogeneration system may use one of the possible methods discussed below.

Described below are two possible configurations of the cogeneration system. The surface of the boiler corresponds to the receiver in the schematic. A heat engine obtains energy from the receiver, a part of which is converted to electricity while the rest is used to heat the fluid stream. The heat engine can be any of the following types: Rankine cycle (using steam or organic fluid), Brayton cycle (using CO2), Stirling cycle, thermoelectric generator, or steam or gas expansion motor. The fluid stream can be liquid water or steam which is then pumped into the well, or it can be the water/bitumen entering the water separation/purification facility.

In Configuration 1, the receiver is built directly into the heat engine and operates as the hot side of the cycle. This is only possible by using thermoelectric or Stirling cycles. This design has the fewest number of components. The difference in Configuration 2 is that there is a heat transfer medium (oil, molten salts, or steam) between the receiver and the heat engine. The advantage here is that a wider range of heat engines can be used and the heat transfer media can be stored to allow for continuous power generation. The disadvantage is the added complexity of the heat exchange system and that there is an additional temperature drop across the heat transfer medium which decreases efficiency.

Figure 8:
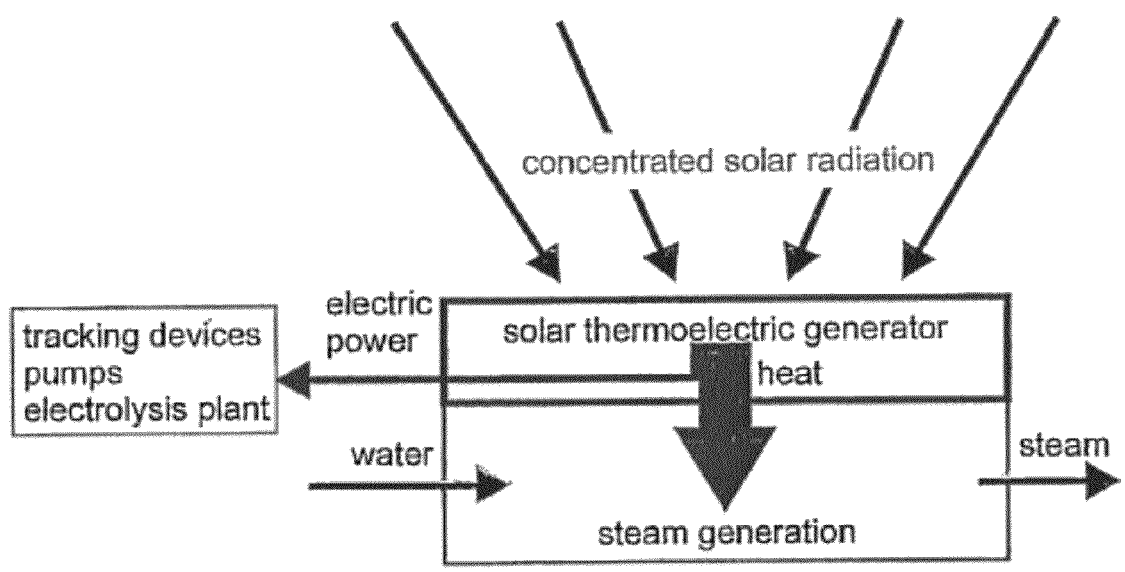
FIG. 8 is a schematic illustration of a solar thermoelectric power generation system that feeds a tracking and pumping device and provides the hydrogen required for the cracking of the bitumen into synthetic oil.

Solar Thermoelectric Generators may be used as the heat engine for the cogeneration system. In one embodiment, these STG's will be installed in the solar focus point on the surface of the boiler as illustrated in FIG. 8. This will not significantly affect the overall system performance as the energy required here is only 5% of the total power supply. Thermoelectric Generators are a robust, low maintenance option and are easy to install as compared to a full blown steam turbine system. STG's may also be able to utilize other secondary sources of cold and hot fluid streams without significant modification.

Figure 9:
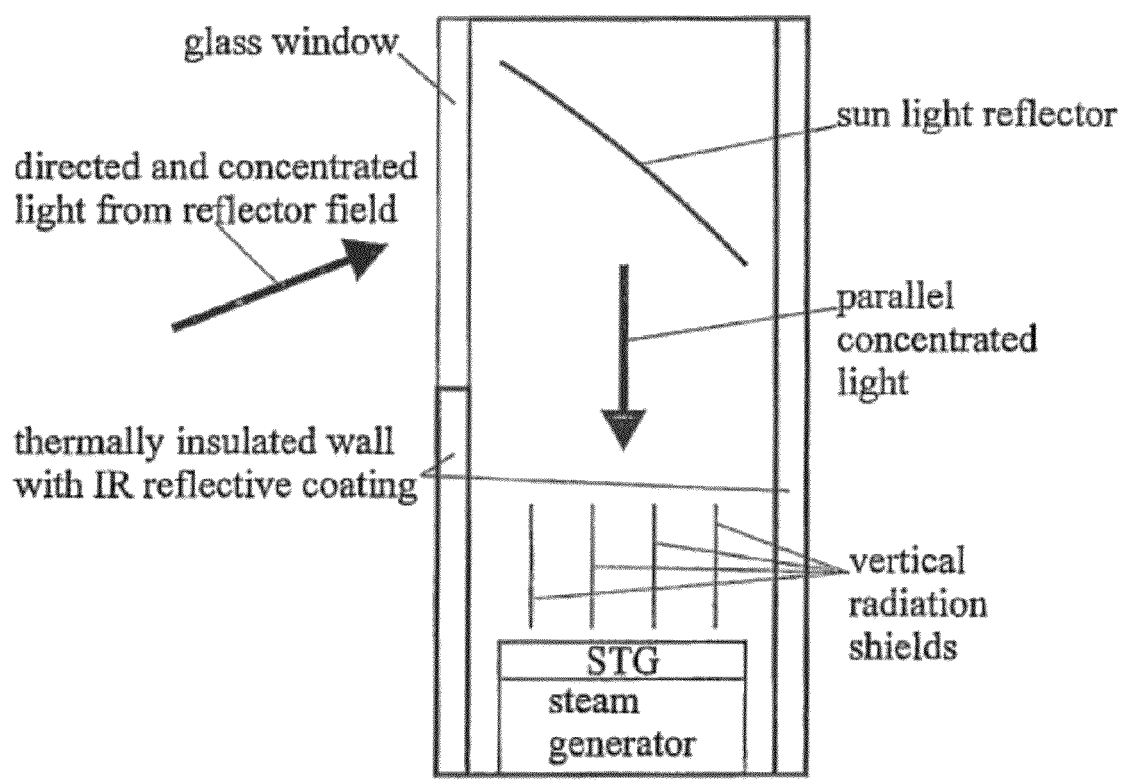
FIG. 9 is a schematic illustration of a power tower design including solar thermoelectric power generation.

Although the conversion efficiency of a solar thermoelectric generator (STG) is relatively low compared to state of the art photovoltaic modules, the major advantage of using this technology lies in the resulting high overall efficiency of the system. The STG module is directly mounted on the boiler; therefore the excess heat which is transferred through the module is used to generate steam. The installation of an STG module represents an addition thermal resistance between the solar radiation and the steam. This inevitably leads to a temperature increase on the hot side surface of the STG in order to provide the same amount of steam at the required pressure and temperature. Consequently, additional irradiation and convection losses arise due to the elevated temperature. This heat loss increase can be confined using for example an insulated tower configuration with vertical radiation shields as shown in FIG. 9.

The required hydrogen volume flow rate for a thermal cracking process of heavy oil is 12 liters per liter of oil. Hence about 19,100 $m^3$ of hydrogen are required in the scenario of oil production of 10,000 barrels per day. For an assumed electrolysis plant efficiency of 70%, the necessary electrical power is about 8.1 $MW_{el}$ which can be provided by a solar thermoelectric generator module. So as to not take away from the heat input to the steam generator, the concentrated solar radiation power (heliostat area) must be increased by this amount (about 5%), neglecting the additional heat losses to the environment due to higher receiver temperature. The relevant numbers are summarized in Table 1.

Figure 10:
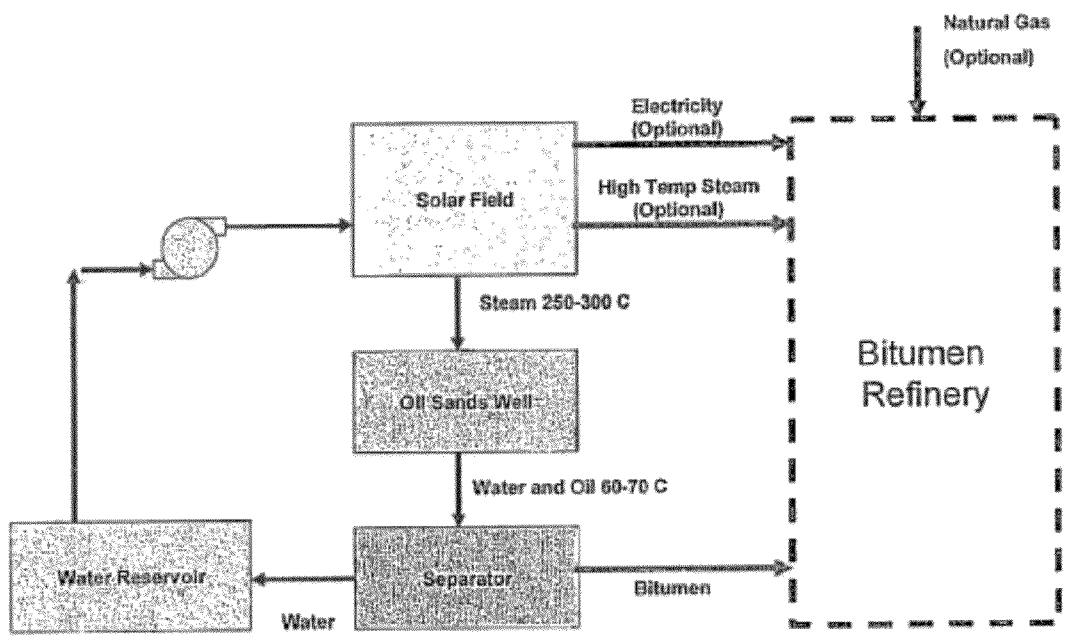
FIG. 10 is a schematic illustration of a bitumen recovery system, consistent with an embodiment of the present invention.

Schematics for the entire proposed system and the upgrading processes with and without natural gas are depicted in FIG. 10 and FIG. 11 respectively.

As shown in FIG. 10, one embodiment of a bitumen recovery system, consistent with an embodiment of the present invention, includes a solar field that provides low temperature steam to an oil sands well and that optionally provides electricity and high temperature steam to a bitumen refinery. Water and oil from the oil sands well is separate by a separator. The water may be provided to a water reservoir and the bitumen is provided to the bitumen refinery where the bitumen may be upgraded with or without using natural gas.

Figure 11A:
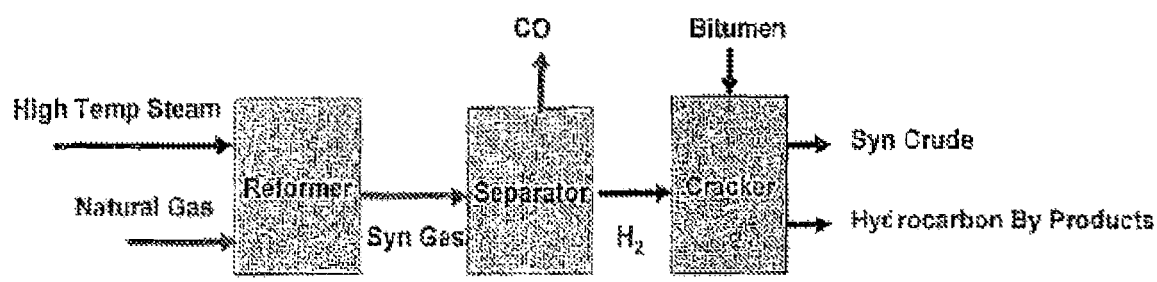
FIG. 11A is a schematic illustration of a bitumen upgrading process with natural gas.
Figure 11B:
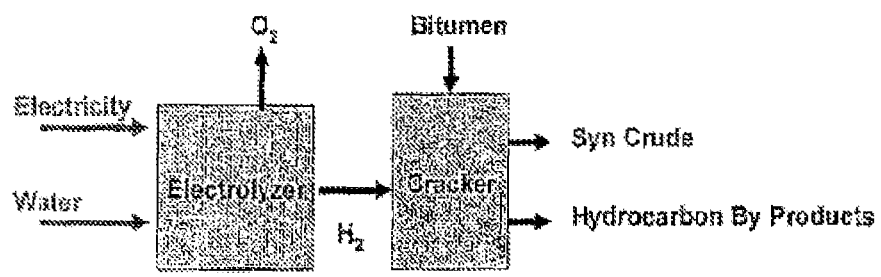
FIG. 11B is a schematic illustration of a bitumen upgrading process without natural gas.

According to one bitumen upgrading process, shown in FIG. 11A, high temperature steam and natural gas are provided to a reformer, which produces syn gas. A separator produces CO and hydrogen ($H_2$) from the syn gas. A cracker uses the hydrogen in a thermal cracking process to upgrade the bitumen to synthetic oil. According to another bitumen upgrading process, shown in FIG. 11B, electricity and water are provided to an electrolyzer, which produces the hydrogen used by the cracker in the thermal cracking process.

TABLE 1

Calculation summary for production of electricity using solar thermoelectric generator module

| | |
|---|---|
| $H_2$ volume flow/heavy oil volume flow | 12:1 |
| Heavy oil volume flow | 10,000 barrels/day |
| $H_2$ volume flow needed for thermal cracking process | 19100 $m^3$/day |

TABLE 1-continued

Calculation summary for production of electricity using solar thermoelectric generator module

| | |
|---|---|
| $H_2$ mol flow | 19.87 mol/s |
| Enthalpy of formation for water (1) | −285.837 kJ/mol |
| Electrolysis plant efficiency | 70% |
| Electric power needed | 8.113 $MW_{el}$ |
| Power needed for steam generation | 157.662 $MW_{th}$ |
| Increase of concentrated solar radiation | 4.89% power needed |

Solar powered steam generation (SPSG) could gain significant market shares in the oil sand industry because it possesses significant financial, socio-political, environmental, and technical advantages over the existing method that generally consists of using a gas power steam generation system.

From a financial perspective, SPSG provides an economical way to provide steam in an environment where gas prices are steadily going up. Table 1 summarizes the installation costs associated with SPSG compared to conventional steam production. The results assume a 10,000 barrel/day production and gas prices of $9.25/MBTU. The results show that neglecting financing and opportunity costs, the investment can be made profitable within 11.8-18.6 years (well below the expected lifetime of the system) beyond which it would generate returns.

SPSG also tackles one of the most important problems that the oil sand industry faces in Canada: declining gas supply. At current production rate, the oil sand producers will need to import gas from Alaska or other regions to produce steam and refine bitumen with a huge up front cost for the required infrastructures. Producing steam using SPSG allows gas produced on-site to be used for the refinement of bitumen. This would stabilize the gas supply chain, prevent the need for gas imports, reduce the risk of a disruption in the gas supply, and hedge the company against fluctuation in natural gas prices.

SPSG can also hedge the oil producers against potential $CO_2$ regulations and socio-political backlash by reducing the environmental footprint of oil sand production. In the case of a carbon tax, the offset on $CO_2$ emissions could even reduce the ROI time to 10.2-15.9 years if one assumes a $CO_2$ tax of the order of $30/ton of $CO_2$. By reducing their environmental footprint, oil producing companies could quench the growing criticisms that oil sand producers are facing and potentially improve their image as good corporate citizens without facing additional production costs. It can also guarantee them access to new resources that governments could be more inclined to let them exploit if done in an environmentally responsible way.

SPSG offers technological and manufacturing advantages compared to mature technology such as gas assisted steam production. One such advantage is the enormous potential for economies of scale associated with the production of minors and tracking devices that will commoditize as production volume increases. Projections predict a price reduction in the heliostats (minor and tracking system) of the order of 65% due to scale, research, design, testing and manufacturing improvements. This would further reduce the return on investment time to 5.5-8.6 years assuming the introduction of carbon tax. Furthermore, with the heliostats in place, SPSG can be easily modified or upgraded to directly produce electricity or hydrogen on site. Producing hydrogen from renewable energy will further reduce the environmental footprint and natural gas dependence of oil sand production.

The periodic and unpredictable nature of the solar energy input leading to steam generation is not matched for the continuous extraction and upgrading of bitumen from oil sand. The use of molten salt or other storage system for the solar energy can allow for a continuous use of the solar energy but the cost associated with such system becomes prohibitive. This discrepancy becomes a major deterrent for the use of the sun as the primary energy source. This problem is solved when one considers that the oil formation itself can be used as a no cost storage solution for the solar produced steam. Storing solar energy as low temperature steam is unheard of because of the low energy density of such a storage system and the immense room needed to store such a large amount of steam. In the case of the bitumen formation, the room necessary is readily available and the low temperature steam stored in the formation overnight keeps heating the bitumen which allows for continuous production.

The low level of solar insolation in the Canadian region where large resources of oil sand are available is a major deterrent for the use of solar powered steam generation. Low insolation leads to poor efficiency and usage of solar concentrating equipments for conventional solar energy generation. This is due in part to the small energy input associated with low insolation but also to the energy waste associated with the system when the sun is low in the sky at sunset and sunrise. The key is to realize that by producing low temperature steam instead of the high temperature steam needed for efficient energy generation one can minimize the energy waste at sunrise and sunset. Moreover, while producing high temperature steam in a low insolation environment would demand a large concentration factor, the production of low temperature steam can be achieved with reasonable concentrations even in regions such as Calgary.

Another obstacle to using solar energy in northern latitudes is the prevalence of harsh weather during a significant fraction of the year. The solar concentrating equipment being designed for large insolation areas are not suited for regions that experience frequent sub freezing temperatures, and snow or ice accumulation. The equipment and tracking systems for the heliostats that are currently used would thus need to be qualified and most likely modified to resist the northern climate. The absence of such technology can explain why the use of solar energy for bitumen extraction is not yet explored.

The availability and the relatively low price of natural gas is a prime factor that has inhibited the development of alternative energy sources for the oil sand exploitation. In an environment where gas is available and where $CO_2$ emission is not taxed in any way, there is little incentive to develop alternative technology. With the era of low energy prices and no $CO_2$ tax coming to an end, the systems and methods described herein become a great alternative.

In the systems and methods consistent with the embodiments of the present invention, the steam temperature is lower than in typical solar applications for power generation. The power generating block efficiency depends on the steam temperature; the higher the steam temperature the higher the overall efficiency. It is thus common practice to design the system to achieve high steam temperatures. There exist rare uses of low temperature steam generation in applications such as those needed in the food industry, but these do not use solar energy. Furthermore, the steam temperature for these processes is below the temperature range of embodiments of the present invention.

Because of the relatively low insolation rates and large required steam outputs, a large installation area for the solar field is required. However, for oil sand recovery, the land where the heliostats will be located is already owned or can be purchased at a low price (oil sands are present in the low populated areas of Alberta) by the oil company exploiting the underground oil resources. This makes the real estate cost hurdle negligible in the proposed system.

One reason why such an idea has not been proposed may be because the oil and solar industries do not have much interaction besides that related to the photovoltaic industry. The two industries have few common technologies or personnel. Looking at both industries and technologies without bias to find a profitable interaction opportunity resulted in the systems and methods described herein.

Thermoelectric Electricity Generation

The production of electricity from thermoelectric devices is extremely inefficient. The coupling of sunlight to thermoelectrics does not make the situation any better due to losses at the collector. The systems and methods consistent with embodiments of the present invention use the thermoelectric device in such a way that the energy waste on the cold side of the device becomes an energy source for steam production. The good thermal conductivity of water and the boiler tank become a prime heat sink for the thermoelectric device and the only major losses in the system are now only limited to the losses on the hot side of the thermoelectric device. Besides, the efficiency of the system becomes even better at the relatively low temperature of the steam being produced.

The quantity of electricity needed to electrolyze the hydrogen remains small compared to the energy input necessary for the other operations. For that reason, setting up an independent thermoelectric system to generate electricity would not make much sense and people have not thought of using thermoelectrics so far. In a design consistent with an embodiment of the present invention, the thermoelectric system is integrated with the steam production unit so that it does not necessitate an independent concentrating or tracking system. It can thus be used without adding complexity to the system.

Heat Production for the Bitumen Upgrading

No solar generated process steam is used in the oil industry for refining or upgrading processes. This is in general also valid within the chemical industry. One can identify various reasons: refineries and upgrading process plans are very energy intensive processes. In order to maximize the investment related to such plans, one opts for huge volume capacity. The use of steam generated by a solar collector adds a level of complexity to convectional plans design and also would require large areas of collectors making solar generated process steam an unfeasible concept from an economical point of view. Refineries and chemical industries are often located in areas close to harbors or in the proximity of their market. As already mentioned, the land price in such locations is usually high, while in the present case, land price in a scarcely populated region such as Alberta is low. Furthermore in the present concept, solar steam generation is an integrated part of the system and for this reason it would not add any extra level of complexity.

The use of the solar energy for steam generation is a cyclic process and interferes with full utilization of the refinery infrastructure. The convention in the existing industry is that continuous processes are preferred in order to maximize the capital investment, and thus a cyclic process would not be an obvious solution.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A method for recovering bitumen from oil sand comprising the steps of:
    generating steam in the temperature range of approximately 230-350° C. using concentrated solar energy;
    injecting steam in the temperature range of approximately 230-350° C. into a formation including bitumen-containing oil sand to decrease viscosity of bitumen to aid in extraction; and
    recovering the bitumen from the formation.

2. The method of claim 1 wherein said concentrated solar energy is produced by a point focusing system.

3. The method of claim 1 wherein the concentrated solar energy is produced by a line focusing system.

4. The method of claim 1 further including creating a steam injecting well for receiving the steam above at least one bitumen recovery well, the steam injecting well allowing for varying flow rates and/or having a larger flow cross-sectional area than that of the at least one bitumen recovery well.

5. The method of claim 1 further including generating electricity from a thermoelectric generator receiving the concentrated solar energy.

6. The method of claim 5 further including upgrading the recovered bitumen into synthetic oil during an upgrading process, wherein the electricity is used to generate hydrogen by electrolysis of water, the hydrogen being used in the upgrading process.

7. The method of claim 5 further including operating tracking and pumping units using the electricity generated from the thermoelectric generator.

8. The method of claim 5 wherein the steam is injected during periods of solar availability.

9. The method of claim 5 wherein the steam is injected at higher rates during periods of peak solar radiation.

10. A method for recovering bitumen from oil sand, the method comprising:
    generating steam in the temperature range of approximately 230-350° C. using concentrated solar energy;
    injecting the steam into a formation including bitumen-containing oil sand to decrease viscosity of bitumen to aid in extraction;
    recovering the bitumen from the formation; and
    upgrading the recovered bitumen into synthetic oil using concentrated solar energy.

11. The method of claim 10 wherein the recovered bitumen is heated to a temperature in the range of approximately 80-150° C. to separate excess water from the recovered bitumen.

12. The method of claim 10 wherein the recovered bitumen is heated partially to an intermediate temperature range of approximately 230-350° C., and fully to a temperature range of approximately 350-550° C.

13. The method of claim 10 further including storing solar energy using a phase change material for energy storage, wherein upgrading the recovered bitumen includes upgrading the recovered bitumen into synthetic oil using heat stored in the phase change material.

14. The method of claim 13 wherein the phase change material is molten salt.

* * * * *